United States Patent [19]
Lee et al.

[11] Patent Number: 6,081,037
[45] Date of Patent: Jun. 27, 2000

[54] SEMICONDUCTOR COMPONENT HAVING A SEMICONDUCTOR CHIP MOUNTED TO A CHIP MOUNT

[75] Inventors: Tien-Yu Tom Lee, Phoenix; James Vernon Hause, Maricopa, both of Ariz.

[73] Assignee: Motorola, Inc., Schaumburg, Ill.

[21] Appl. No.: 09/102,092

[22] Filed: Jun. 22, 1998

[51] Int. Cl.[7] .............................. H01L 23/10; H01L 23/34
[52] U.S. Cl. .......................... 257/778; 257/706; 257/707
[58] Field of Search .................................... 257/706, 707, 257/779, 787, 718, 719, 691, 778

[56] References Cited

U.S. PATENT DOCUMENTS

| | | |
|---|---|---|
| 3,972,062 | 7/1976 | Hopp . |
| 4,000,509 | 12/1976 | Jarvela ........................... 357/81 |
| 4,129,042 | 12/1978 | Rosvold ......................... 73/727 |
| 4,323,914 | 4/1982 | Berndlmaier et al. ............. 357/82 |
| 4,710,798 | 12/1987 | Marcantonio . |
| 4,764,659 | 8/1988 | Minami et al. .................. 219/216 |
| 5,019,673 | 5/1991 | Juskey et al. . |
| 5,151,388 | 9/1992 | Bakhit et al. ................... 437/209 |
| 5,280,192 | 1/1994 | Kryzaniwsky . |
| 5,289,337 | 2/1994 | Aghazadeh et al. ............. 361/718 |
| 5,336,639 | 8/1994 | Nagaraj et al. ................. 437/217 |
| 5,352,926 | 10/1994 | Andrews ......................... 257/717 |
| 5,371,404 | 12/1994 | Juskey et al. . |
| 5,444,300 | 8/1995 | Sato et al. . |
| 5,455,387 | 10/1995 | Hoffman et al. ................. 174/52.4 |
| 5,455,457 | 10/1995 | Kurokawa ...................... 257/712 |
| 5,521,406 | 5/1996 | Tserng et al. ................... 257/276 |
| 5,523,260 | 6/1996 | Missele .......................... 439/209 |
| 5,572,405 | 11/1996 | Wilson et al. ................... 361/705 |
| 5,585,671 | 12/1996 | Nagesh et al. .................. 257/697 |
| 5,621,615 | 4/1997 | Dawson et al. ................. 361/704 |
| 5,672,548 | 9/1997 | Culnane et al. ................. 437/209 |
| 5,708,283 | 1/1998 | Wen et al. ...................... 257/276 |
| 5,726,079 | 3/1998 | Johnson ......................... 438/106 |
| 5,737,191 | 4/1998 | Horiuchi et al. ................ 361/764 |
| 5,744,863 | 4/1998 | Culnane et al. ................. 257/712 |
| 5,754,402 | 5/1998 | Matsuzaki et al. .............. 361/707 |
| 5,821,628 | 10/1998 | Hotta . |

*Primary Examiner*—Sheila V. Clark

[57] ABSTRACT

A semiconductor device (30) includes a semiconductor chip (11) flip chip mounted on a substrate (21) and a thermally conductive chip mount (31) mounded on the semiconductor chip (11). The thermally conductive chip mount (31) has a cavity (34) formed therein. The semiconductor chip (11) fits in the cavity (34) and is thermally coupled to the thermally conductive chip mount (31). The thermally conductive chip mount (31) provides a thermal conduction path to dissipate heat generated in the semiconductor chip (11) through its sidewalls (15, 16, 17, 18).

5 Claims, 5 Drawing Sheets

SEMICONDUCTOR COMPONENT HAVING A SEMICONDUCTOR CHIP MOUNTED TO A CHIP MOUNT

BACKGROUND OF THE INVENTION

The present invention relates, in general, to semiconductor devices and, more particularly, to semiconductor device packages.

Many semiconductor devices such as, for example, memory devices, logic devices, microprocessors, microcontrollers can be packaged in flip chip ball grid array (FC-BGA) packages. These packages are superior to conventional device packages, e.g., quad flat packages (QFPs) and wire bond BGA packages, in terms of cost, size, weight, reliability, number of input/output (I/O) terminals, etc. Because of their compact sizes, heat dissipation is usually poor in FC-BGA packages. The poor heat dissipation often adversely affects the thermal performance of the semiconductor devices and limits semiconductor devices in low power applications.

A heat sink can be used to improve the heat dissipation of a semiconductor device. In a flip chip package, the heat sink is conventionally attached to the back side of a chip in the semiconductor device. The heat sink increases the cost, weight, and size of the semiconductor device. More particularly, the heat sink significantly increases the height of the device.

Accordingly, it would be advantageous to have a method for packaging a semiconductor chip into a semiconductor device that has a superior thermal performance. It is desirable for the device to be small in size, light in weight, and low in cost. It is particularly desirable for the device to have a low profile. It is also desirable for the method to be simple and time efficient. It would be of further advantage for the method to be compatible with existing device packaging processes.

DETAILED DESCRIPTION OF THE DRAWINGS

Figure 1:
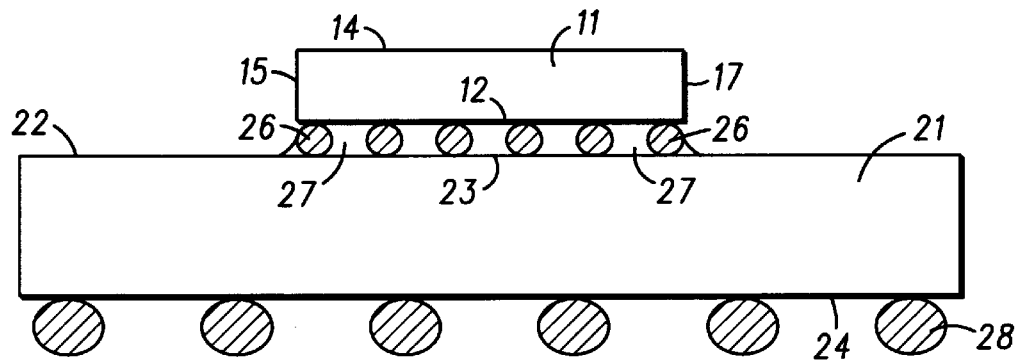
FIG. 1 is a cross-sectional view of a semiconductor device in a conventional flip chip bumped package.

Generally, the present invention provides a method for packaging a semiconductor chip into a semiconductor device that has a superior thermal performance. The chip can include a discrete semiconductor device such as, for example, a field effect transistor, a bipolar transistor, a diode, a resistor, etc. or an integrated circuit such as, for example, a power amplifier, a memory circuit, a logic circuit, a microprocessor, etc. The chip is in a flip chip bumped package. A thermally conductive chip mount has a chip receiving area thermally coupled to the chip. The heat generated in the chip can dissipate to the chip mount through the sides of the chip. Compared with a conventional heat sink mounted on the back side of a flip chip, the chip mount of the present invention has a low profile.

These and other features and advantages will be more clearly understood from the following detailed description taken in conjunction with specific examples and accompanying figures. It should be noted that the figures are not necessarily drawn to scale, and that there may be other embodiments of the present invention which are not specifically illustrated. It should also be noted that, where considered appropriate, reference numerals are repeated among the figures to indicate corresponding or analogous elements.

FIG. 1 is a schematic cross-sectional view of a semiconductor device 10 in a conventional flip chip bumped package. Semiconductor device 10 includes a semiconductor die or a semiconductor chip 11 flip chip mounted on a substrate 21. Chip 11 has a front surface 12, a back surface 14, and a rectangular periphery comprised of four sidewalls. FIG. 1 shows two opposing sidewalls 15 and 17 of chip 11. Substrate 21 has a first major surface 22 and a second major surface 24. Chip 11 is bump bonded to substrate 21 via an array of solder bumps 26 formed between front surface 12 of chip 11 and a portion 23 of first major surface 22 of substrate 21. Solder bumps 26 are coupled to various elements on the internal circuitry (not shown) fabricated on chip 11. A filling material, e.g., an epoxy, fills a space between front surface 12 of chip 11, major surface 22 of substrate 21, and solder bumps 26, thereby forming an underfill 27. Underfill 27 provides mechanical support to chip 11 and conducts heat from chip 11 to substrate 21. An array of solder bumps 28 is formed on second major surface 24 of substrate 21. Solder bumps 28 are coupled to corresponding solder bumps 26 through conductive vias (not shown) formed in substrate 21. Solder bumps 28 serve to transmit input and output signals of semiconductor chip 11.

Semiconductor device 10 is typically mounted on a printed circuit board (not shown) via solder bumps 28 and coupled to other circuit elements (not shown). An underfill (not shown) may be used between major surface 24 of substrate 21 and the circuit board to provide additional mechanical support to semiconductor device 10. In operation, the internal circuitry in chip 11 will generate heat. In semiconductor device 10, the only significant mechanism of heat dissipation is a thermal conduction path from chip 11 through front surface 12, solder bumps 26, underfill 27, and major surface 22 to substrate 21. The percentage of heat generated in chip 11 that must dissipate through the thermal conduction path depends on the size and shape of chip 11. For example, when chip 11 has an area of approximately 40 square millimeters ($mm^2$) and a thickness of approximately 500 micrometers ($\mu$m), approximately 97 percent (%) of the heat generated in chip 11 must dissipate through this thermal conduction path. Substrate 21 is usually made of an organic resin that has a low thermal conductivity. Therefore, the heat dissipation efficiency of semiconductor device 10 is usually low. In other words, semiconductor device 10 has a high thermal resistance, e.g., in a range between approximately 25 degrees Celsius per watt (° C./W) and approximately 40° C./W. The low heat dissipation efficiency adversely affects the thermal performance of semiconductor device 10 and often limits its use in low power applications, e.g., less than approximately 1 watt (W).

Figure 2:
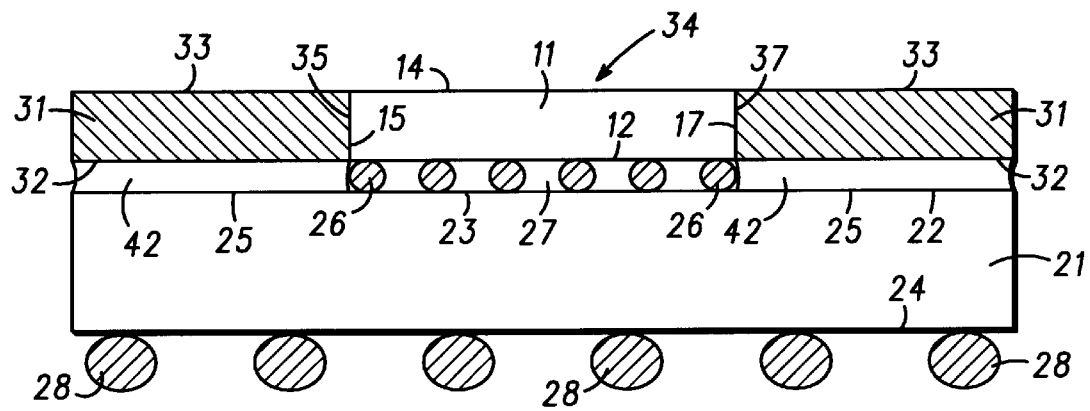
FIGS. 2 and 3 are a cross-sectional view and a top view, respectively, of a semiconductor device in a flip chip bumped package in accordance with an embodiment of the invention.
Figure 3:
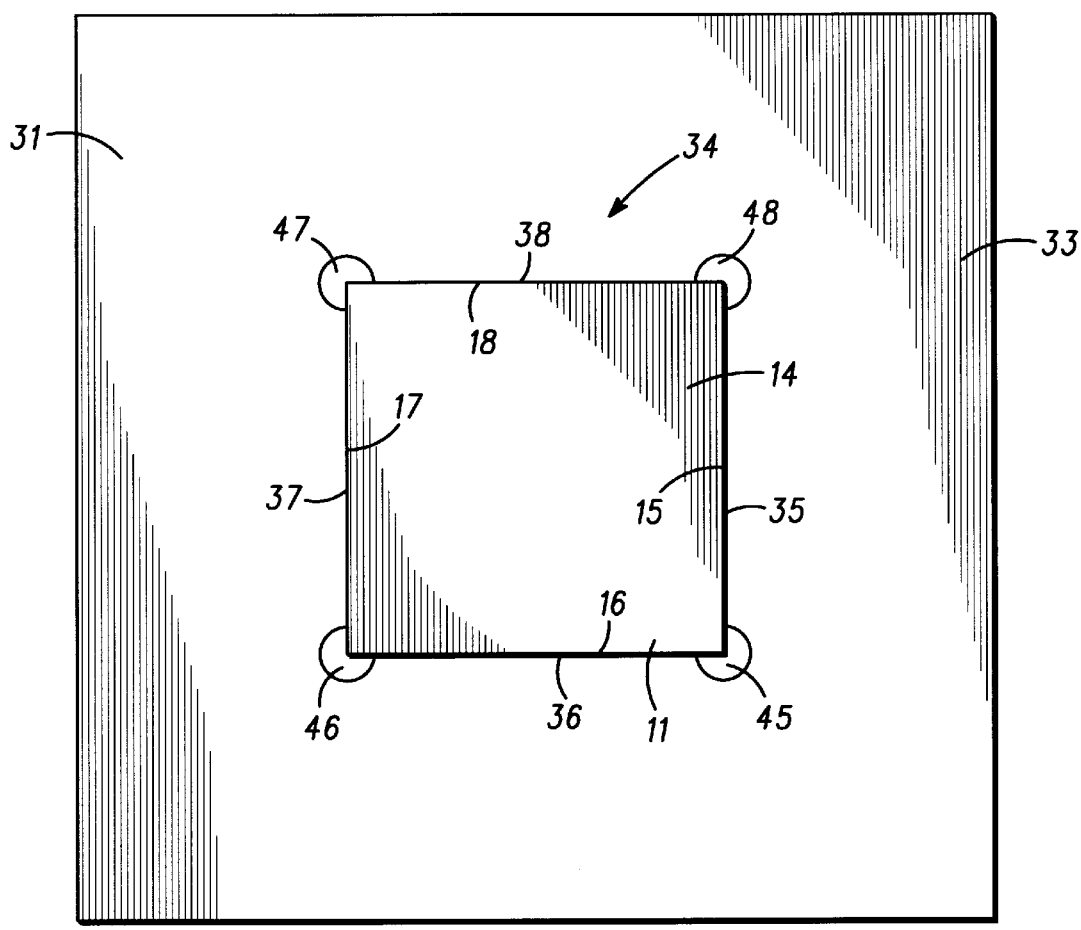

A semiconductor device 30 in a flip chip ball grid array bumped package in accordance with a first embodiment of the present invention is schematically shown in FIGS. 2 and 3. More particularly, FIG. 2 is a cross-sectional view of semiconductor device 30 and FIG. 3 is a top view of semiconductor device 30. Like semiconductor device 10 of FIG. 1, semiconductor device 30 includes semiconductor chip 11 flip chip bump mounted to major surface 22 of substrate 21 via array of solder bumps 26 and underfill 27.

FIG. 3 shows chip 11 having four sidewalls 15, 16, 17, and 18 forming the periphery of rectangularly shaped semiconductor chip 11.

In addition to the features corresponding to those in semiconductor device 10 of FIG. 1, semiconductor device 30 includes a chip mount 31 surrounding chip 11 and having a front surface 32 and a back surface 33 substantially coplanar with front surface 12 and back surface 14, respectively, of chip 11. Chip mount 31 has a cavity 34 therein extending from front surface 32 to back surface 33. Cavity 34 has edges 35, 36, 37, and 38 substantially parallel to corresponding sidewalls 15, 16, 17, and 18 of chip 11. Cavity 34 also has relief notches or relief cuts 45, 46, 47, and 48 at its four corners. Cavity 34 receives chip 11 and is also referred to as a receptacle in chip mount 31. Chip mount 31 is preferably made of a thermally conductive material, e.g., copper, aluminum, etc. Cavity 34 and relief cuts 45, 46, 47, and 48 can be formed using techniques such as, for example, milling, drilling, stamping, etc.

Cavity 34 is formed in such a way that its area defined by edges 35, 36, 37, and 38 is slightly smaller than the area of chip 11 defined by sidewalls 15, 16, 17, and 18. In order to mount chip mount 31 around chip 11, cavity 34 is enlarged through thermal expansion by heating chip mount 31. When cavity 34 is enlarged or expanded to have an area larger than that of chip 11, chip 11 is inserted into cavity 34. After chip mount 31 cools down to room temperature, cavity 34 contracts and edges 35, 36, 37, and 38 compress sidewalls 15, 16, 17, and 18, respectively. Chip 11 fits tightly in cavity 34. Relief cuts 45, 46, 47, and 48 serve to relieve tension or stress in chip mount 31 during the expansion and contraction processes, thereby preventing cracks in chip mount 31 that might otherwise form in chip mount 31 around the corners of cavity 34. Thermal grease (not shown) is applied on sidewalls 15, 16, 17, and 18 and edges 35, 36, 37, and 38 before fitting chip 11 in cavity 34. After chip 11 fits in cavity 34, the thermal grease fills voids that might be present between sidewalls 15, 16, 17, and 18 of chip 11 and edges 35, 36, 37, and 38, respectively, of chip mount 31 and ensures good thermal contacts between chip 11 and chip mount 31. The process of fitting chip 11 into chip mount 31 can be performed either before or after chip 11 is flip chip mounted to substrate 21.

Semiconductor device 30 also includes an underfill 42 between front surface 32 of chip mount 31 and a portion 25 of major surface 22 of substrate 21. Like underfill 27 between front surface 12 of chip 11 and major surface 22 of substrate 21, underfill 42 is preferably made of an electrically insulative and thermally conductive material, e.g., a thermally conductive epoxy. Underfill 42 can also be made of thermal grease. Underfill 42 thermally couples chip mount 31 to substrate 21 and provides mechanical support for chip mount 31. The process of underfilling chip mount 31 can be performed either in the same process as or in a separate process from that of underfilling chip 11.

In semiconductor device 30, there are two significant thermal conduction paths through which the heat generated in chip 11 is dissipated, one from chip 11 to substrate 21 through front surface 12 of chip 11, the other from chip 11 to chip mount 31 through sidewalls 15, 16, 17, and 18 of chip 11. The heat transferred from chip 11 to chip mount 31 is further dissipated through a thermal conduction path from chip mount 31 to substrate 21 via front surface 32 of chip mount 31, underfill 42, portion 25 of major surface 22 of substrate 21. Chip mount 31 greatly enhances the heat dissipation efficiency of semiconductor device 30. The thermal performance of semiconductor device 30 is superior to that of semiconductor device 10. Semiconductor device 30 can be used in relatively high power applications. For example, if chip 11 has an area of approximately 40 mm$^2$ and a thickness of approximately 500 $\mu$m, approximately 67% of the heat generated in chip 11 dissipates to chip mount 31 through sidewalls 15, 16, 17, and 18, and approximately 31% of the heat generated in chip 11 dissipates to substrate 21 through front surface 12. The thermal resistance of semiconductor device 30 is between approximately 14° C./W and approximately 16° C./W as opposed to greater than approximately 25° C./W in semiconductor device 10. The power of semiconductor device 30 can be approximately 75% higher than that of semiconductor device 10.

The thickness of chip mount 31 is preferably substantially equal to that of chip 11, which is, by way of example, between approximately 200 $\mu$m and approximately 800 $\mu$m. Therefore, the height of semiconductor device 30 is substantially equal to that of semiconductor device 10. Semiconductor device 30 has a very low profile compared with a prior art semiconductor device having a heat sink mounted to the back surface of the semiconductor chip. Chip mount 31 improves the thermal performance of semiconductor device 30 without increasing its profile.

Figure 4:
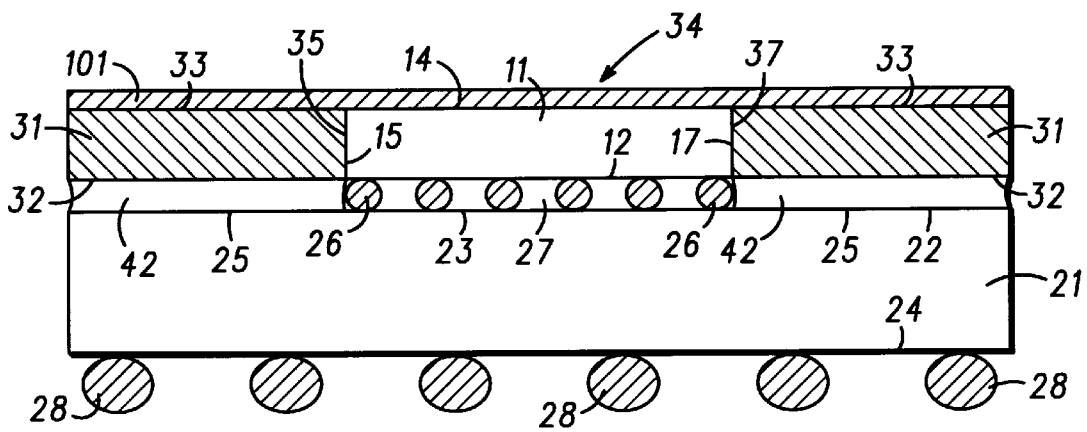
FIGS. 4 and 5 are cross-sectional views of semiconductor devices in flip chip bumped packages in accordance with alternative embodiments of the invention.
Figure 5:
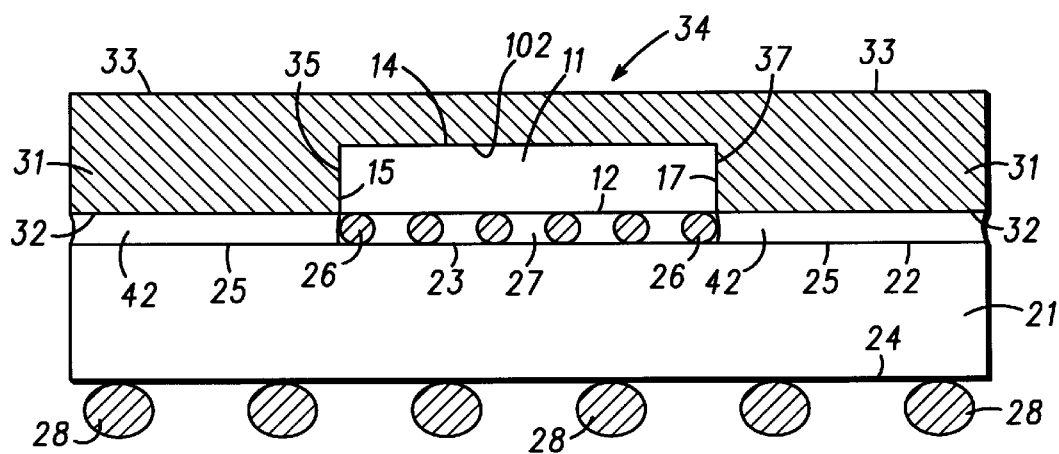
Figure 6:
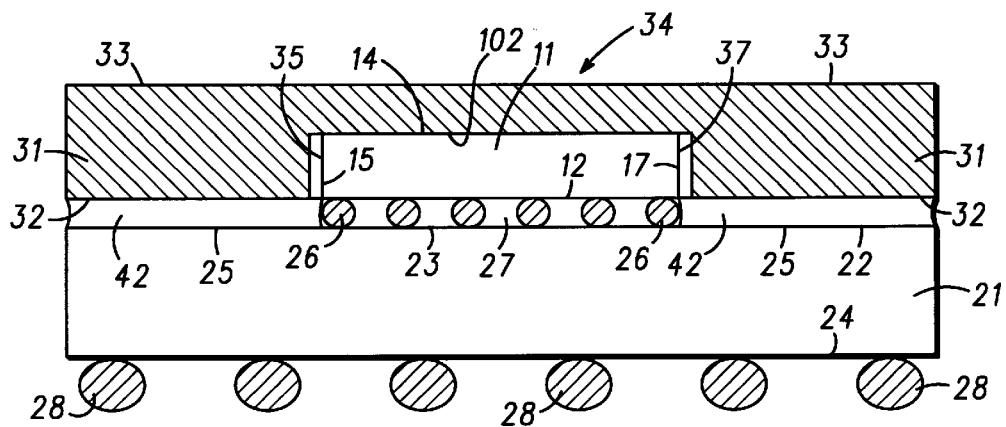

It should be understood that the structure of semiconductor device 30 and the process of packaging semiconductor chip 11 into semiconductor device 30 are not limited to those described hereinbefore. For example, the thermal grease applied to sidewalls 15, 16, 17, and 18 of chip 11 and edges 35, 36, 37, and 38 of cavity 34 is optional. Chip 11 and cavity 34 in chip mount 31 are not limited to being rectangularly shaped. They can have any shape such as, for example, circular, elliptical, triangular, pentagonal, hexagonal, etc. Further, the shape of cavity 34 can be different from that of chip 11. In order for semiconductor device 30 to have efficient heat dissipation, at least one edge of cavity 34 is preferably substantially parallel to a corresponding sidewall of chip 11 and a good thermal contact is established between the at least one edge and the corresponding sidewall. FIG. 3 shows the boundaries of relief cuts 45, 46, 47, and 48 as arcs. These are not intended as a limitation on the shapes of relief cuts 45, 46, 47, and 48. Further, relief cuts 45, 46, 47, and 48 are optional in chip mount 31. FIG. 4 illustrates an alternative embodiment in which semiconductor device 30 includes a heat spreader 101 overlying back surface 14 of chip 11 and back surface 33 of chip mount 31. The heat spreader is thermally coupled to both chip 11 and chip mount 31. The heat spreader provides a thermal conduction path for dissipating heat from chip 11 through back surface 14, thereby further enhancing the thermal performance of semiconductor device 30. FIG. 5 illustrates an alternative embodiment in which cavity 34 is a dent in front surface 32 that extends only partially into chip mount 31. Therefore, cavity 34 has a base surface 102 between front surface 32 and back surface 33 of chip mount 31. The base surface is thermally coupled to back surface 14 of chip 11 and provides a thermal conduction path for dissipating heat from chip 11 through back surface 14. In addition, chip 11 is not limited to being fit into chip mount 31 by heating chip mount 31 to enlarge cavity 34. FIG. 6 illustrates yet another embodiment in which the area of cavity 34 defined by edges 35, 36, 37, and 38 is slightly larger than that of chip 11 defined by sidewalls 15, 16, 17, and 18. Chip 11 is placed in cavity 34 and thermally coupled to chip mount 31 via a thermally conductive material such as, for example, epoxy.

Figure 7:
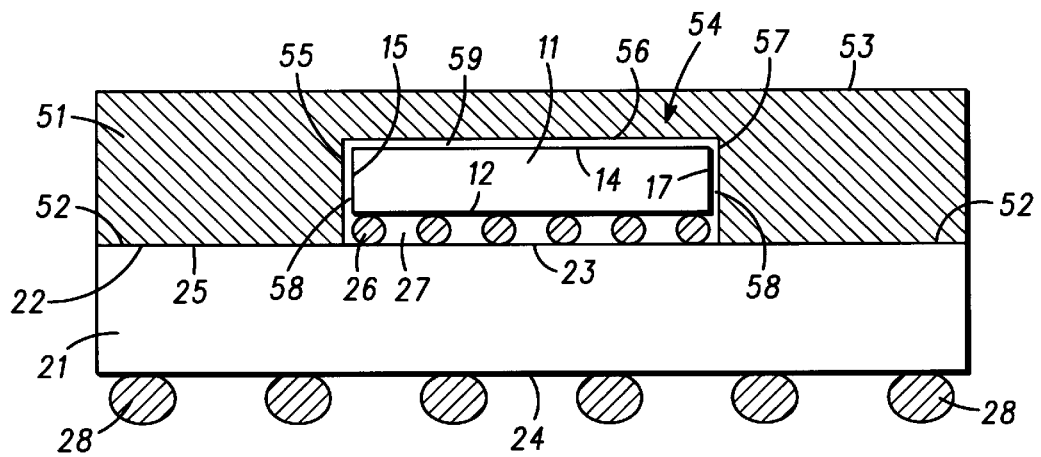

FIG. 7 is a schematic cross-sectional view of a semiconductor device 50 in a flip chip ball grid array bumped package in accordance with a second embodiment of the present invention. Like semiconductor device 10 shown in FIG. 1 and semiconductor device 30 shown in FIGS. 2 and 3, semiconductor device 50 includes semiconductor chip 11 flip chip mounted on substrate 21 via array of solder bumps 26 and underfill 27.

Semiconductor device 50 includes a chip mount 51 having a front surface 52 and a back surface 53. Chip mount 51 has a dent or a cavity 54 in front surface 52 extending partially into chip mount 51. A base surface 56 of cavity 54 is between front surface 52 and back surface 53 of chip mount 51. Base surface 56 overlies back surface 14 of chip 11. Cavity 54 has four edges substantially matching corresponding four sidewalls of chip 11. FIG. 7 shows edges 55 and 57 opposite to each other and corresponding to sidewalls 15 and 17, respectively, of chip 11. Cavity 54 receives chip 11 and is also referred to as a chip receptacle in chip mount 51. Like chip mount 31 in semiconductor device 30 of FIGS. 2 and 3, chip mount 51 is preferably made of a thermally conductive material, e.g., copper, aluminum, etc.

The area of cavity 54 is substantially equal to or slightly larger than the area of chip 11. In order to mount chip mount 51 on chip 11, chip 11 is inserted into cavity 54 and a coupling layer 58 is formed from a thermally conductive filling material, e.g., an epoxy, a thermal grease, etc. Coupling layer 58 thermally and mechanically couples the four edges of cavity 54 to the corresponding four sidewalls of chip 11. Semiconductor device 50 further includes a coupling layer 59 between base surface 56 and back surface 14 that thermally and mechanically couples chip mount 51 to chip 11. Coupling layer 59 can be made of the same thermally conductive material and formed in the same steps as coupling layer 58. The process of mounting chip mount 51 onto chip 11 can be performed either before or after chip 11 is flip chip mounted to substrate 21.

Cavity 54 has a depth substantially equal to the sum of the thickness of chip 11 and the height of solder bumps 26 between chip 11 and substrate 21. When chip mount 51 is mounted on chip 11, front surface 52 is in direct contact with portion 25 of major surface 24 of substrate 21. A thermal grease (not shown) is applied on front surface 52 and portion 25 of major surface 22. The thermal grease fills voids that might be present between front surface 52 of chip mount 51 and major surface 22 of substrate 21, thereby ensuring good thermal contact between chip mount 51 and substrate 21.

In semiconductor device 50, there are three thermal conduction paths through which the heat generated in chip 11 dissipates, one from chip 11 to substrate 21 through front surface 12 of chip 11, one from chip 11 to chip mount 51 through the sidewalls of chip 11, and one from chip 11 to chip 51 through back surface 14 of chip 11. The heat transferred from chip 11 to chip mount 51 is further dissipated through a thermal conduction path from chip mount 51 to substrate 21 through front surface 52 of chip mount 51. Chip mount 51 improves the heat dissipation efficiency of semiconductor device 50. The thermal performance of semiconductor device 50 is superior to that of semiconductor device 10. Semiconductor device 50 can be used in relatively high power applications.

Semiconductor device 50 is slightly taller than semiconductor device 10. The difference between the height of semiconductor device 50 and that of semiconductor device 10 is substantially equal to the distance between base surface 56 of cavity 54 and back surface 53 of chip mount 51, which is, by way of example, between approximately 200 $\mu$m and approximately 800 $\mu$m. The profile of semiconductor device 50 is slightly higher than that of semiconductor device 10 and much lower than that of a prior art semiconductor device having a heat sink mounted to the back surface of the semiconductor chip. Chip mount 51 greatly enhances the thermal performance of semiconductor device 50 without significantly increasing its profile.

Figure 8:
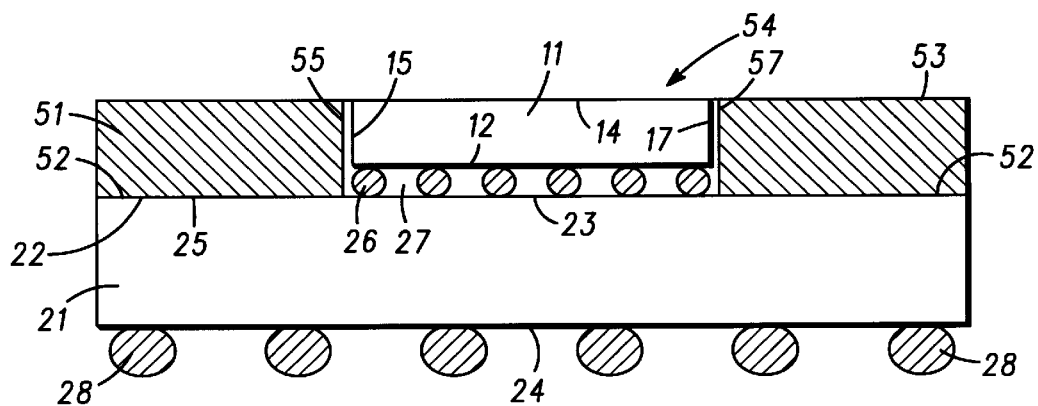
Figure 9:
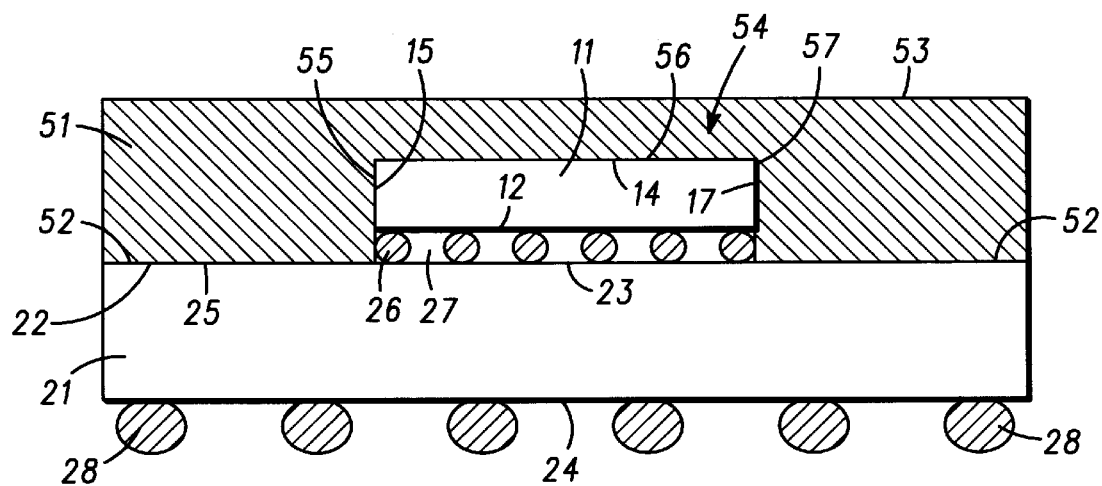

It should be understood that the structure of semiconductor device 50 and the process of packaging semiconductor chip 11 into semiconductor device 50 are not limited to those described hereinbefore. For example, chip 11 and cavity 54 in chip mount 51 are not limited to being rectangularly shaped. They can have any shape such as, for example, circular, elliptical, triangular, pentagonal, hexagonal, etc. Further, the shape of cavity 54 can be different from that of chip 11. Front surface 52 of chip mount 51 is not limited to being in direct contact with major surface 22 of substrate 21. They can be thermally and mechanically coupled to each other via a thermally conductive underfill. FIG. 8 illustrates an embodiment in which cavity 54 is a hole in chip mount 51 extending from front surface 52 to back surface 53 and back surface 14 of chip 11 is substantially coplanar with back surface 53 of chip mount 51. Optionally semiconductor device 50 can further include a heat spreader similar to heat spreader 101 (see FIG. 4) overlying back surface 14 of chip 11 and back surface 53 of chip mount 51. The heat spreader is further thermally coupled to both chip 11 and chip mount 51. The heat spreader provides a thermal conduction path for dissipating heat from chip 11 through back surface 14. In addition, chip mount 51 is not limited to being attached to chip 11 via coupling layer 58. FIG. 9 illustrates an embodiment in which the area of cavity 54 is slightly smaller than that of chip 11, and chip 11 is fit into chip mount 51 by heating chip mount 51 to enlarge cavity 54.

Figure 10:
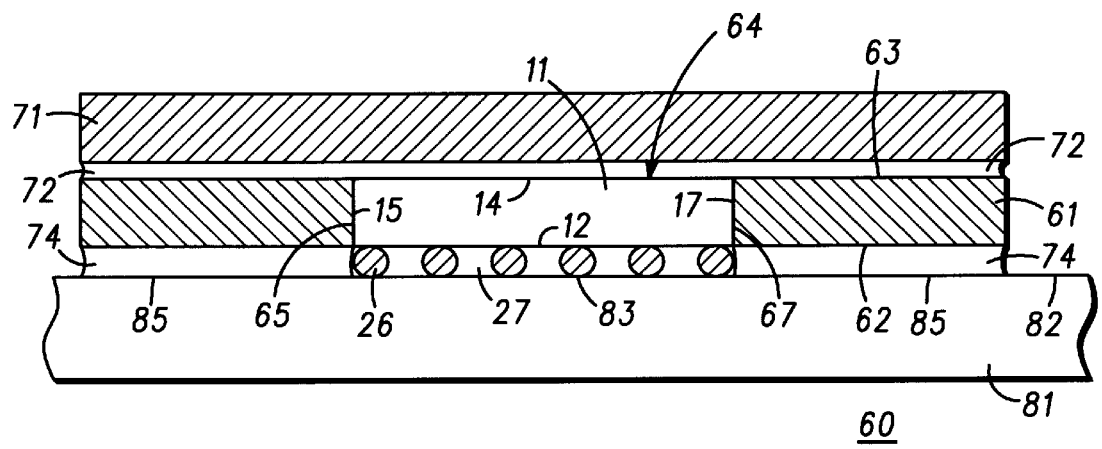

FIG. 10 is a schematic cross-sectional view of a semiconductor device 60 in a flip chip ball grid array bumped package in accordance with a third embodiment of the present invention. Like semiconductor device 10 of FIG. 1, semiconductor device 60 includes semiconductor chip 11. Chip 11 is flip chip mounted on a printed circuit board 81 via array of solder bumps 26 and underfill 27. In other words, printed circuit board 81 functions like a substrate to chip 11. A semiconductor device, e.g., semiconductor device 60, having a semiconductor chip, e.g., chip 11, directly mounted on a printed circuit board, e.g., circuit board 81, is usually referred to as a device in a chip on board package or a direct chip attachment package. Circuit board 81 has a major surface 82. Chip 11 is attached to a portion 83 of major surface 82. Circuit board 81 has conductive traces (not shown) therein for coupling chip 11 to other circuit elements (not shown) on circuit board 81.

Semiconductor device 60 includes a thermally conductive chip mount 61 having a front surface 62 and a back surface 63. Chip mount 61 has a cavity 64 therein extending from front surface 62 to back surface 63. Cavity 64 has four edges substantially parallel to the corresponding four sidewalls of chip 11. FIG. 10 shows edges 65 and 67 opposite to each other and corresponding to sidewalls 15 and 17, respectively, of chip 11. Cavity 64 receives chip 11 and is also referred to as a receptacle in chip mount 61. Like chip mount 31 in semiconductor device 30 shown in FIGS. 2 and 3, chip mount 61 is preferably made of a thermally conductive material, e.g., copper, aluminum, etc.

Cavity 64 is made in such a way that its area is smaller than the area of chip 11. In a process similar to that of mounting chip mount 31 to chip 11 to form semiconductor device 30, chip mount 61 is mounted on chip 11 by heating chip mount 61 to temporarily expand cavity 64, fitting chip 11 into expanded cavity 64, and cooling chip mount 61 so that cavity 64 contract and its edges compress the sidewalls of chip 11. Relief cuts (not shown) can be formed at the corners of cavity 64 to relieve tension or stress in chip mount 61 during the expansion and contraction processes. Thermal grease (not shown) is applied on the sidewalls of chip 11 and the edges of cavity 64. The thermal grease fills voids that might be present between the sidewalls of chip 11 and the corresponding edges of chip mount 61, thereby ensuring good thermal contacts between chip 11 and chip mount 61. After being mounted on chip 11, back surface 63 of chip mount 61 is preferably substantially coplanar with back surface 14 of chip 11. The process of fitting chip 11 into chip mount 61 can be performed either before or after chip 11 is flip chip mounted to circuit board 81.

Semiconductor device 60 also includes a heat spreader 71 overlying chip 11 and chip mount 61. A coupling layer 72 formed from a thermally conductive material, e.g., an epoxy, a thermal grease, etc., thermally and mechanically couples heat spreader 71 to back surface 14 of chip 11. Coupling layer 72 also couples heat spreader 71 to back surface 63 of chip mount 61. Semiconductor device 60 further includes an underfill 74 between front surface 62 of chip mount 61 and a portion 85 of major surface 82 of circuit board 81. Like underfill 27 between chip 11 and circuit board 81, underfill 74 is preferably made of an electrically insulative and thermally conductive material, e.g., a thermally conductive epoxy. Underfill 74 can also be made of thermal grease. Underfill 74 thermally and mechanically couples chip mount 61 to circuit board 81. Underfilling chip mount 61 can be performed either in the same process as or in a separate process from underfilling chip 11.

By way of example, the thickness of the heat spreader 71 is between approximately 200 µm and approximately 800 µm. The profile of semiconductor device 60 is slightly higher than that of a conventional semiconductor device in a chip on board package and much lower than that of a prior art semiconductor device having a heat sink mounted to the back surface of the semiconductor chip. In semiconductor device 60, there are three thermal conduction paths through which the heat generated in chip 11 dissipates, one from chip 11 to circuit board 81 via front surface 12 of chip 11, one from chip 11 to chip mount 61 via the sidewalls of chip 11, and one from chip 11 to heat spreader 71 via back surface 14 of chip 11. The heat transferred to heat spreader 71 is further transferred to chip mount 61 through a thermal conduction path from heat spreader 71 to chip mount 61 via back surface 63 of chip mount 61. The heat transferred to chip mount 61 further dissipates through a thermal conduction path from chip mount 61 to circuit board 81 via front surface 62 of chip mount 61. Chip mount 61 and heat spreader 71 greatly improve the heat dissipation efficiency of semiconductor device 60, thereby enhancing the thermal performance of semiconductor device 60 without significantly increasing its profile. Semiconductor device 60 can be used in relatively high power applications.

Figure 11:
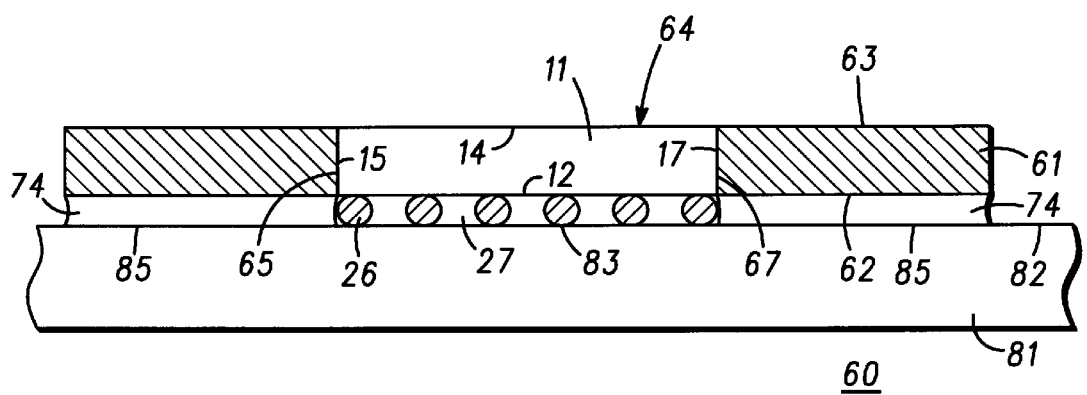
Figure 12:
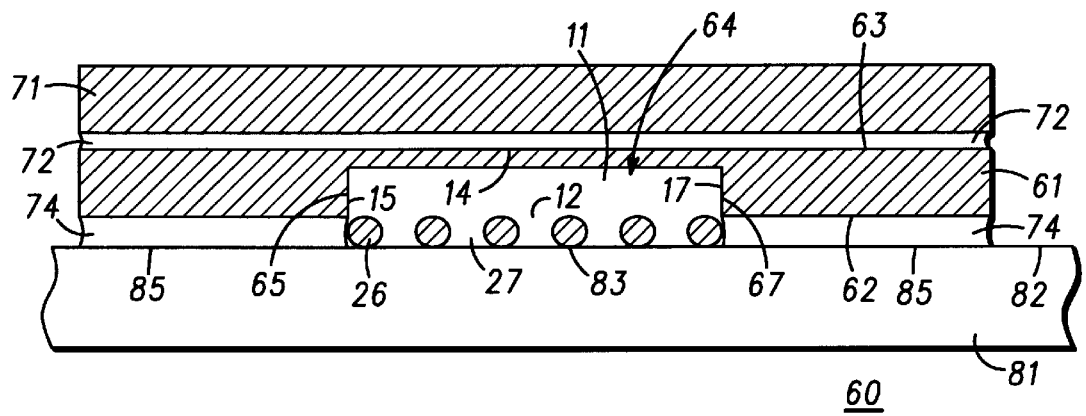
Figure 13:
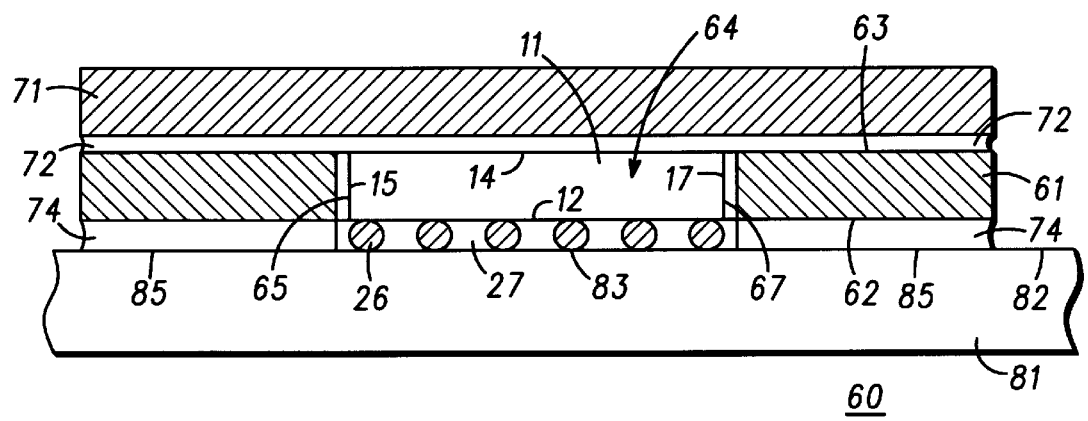

It should be understood that the structure of semiconductor device 60 and the process of packaging semiconductor chip 11 into semiconductor device 60 are not limited to those described hereinbefore. For example, the thermal grease applied to the sidewalls of chip 11 and edges of cavity 64 is optional. Chip 11 and cavity 64 in chip mount 61 are not limited to being rectangularly shaped. They can have any shape such as, for example, circular, elliptical, triangular, pentagonal, hexagonal, etc. Further, the shape of cavity 64 can be different from that of chip 11. In order for semiconductor device 60 to have efficient heat dissipation, at least one edge of cavity 64 is preferably substantially parallel to a corresponding sidewall of chip 11 and a good thermal contact is established between the at least one edge and the corresponding sidewall. Heat spreader 71 is optional in semiconductor device 60. FIG. 11 illustrates an embodiment in which semiconductor device 60 does not include heat spreader 71 and has a profile lower than that shown in FIG. 12, which illustrates an embodiment in which cavity 64 extends from front surface 62 of chip mount 61 only partially into chip mount 61. Therefore, cavity 64 has a base surface (not shown) between front surface 62 and back surface 63 of chip mount 6.1. The base surface is thermally coupled to back surface 14 of chip 11 and provides a thermal conduction path for dissipating heat from chip 11 through back surface 14. In addition, chip 11 is not limited to being fit into chip mount 61 by heating chip mount 61 to enlarge cavity 64. FIG. 13 which illustrates an embodiment in which the area of cavity 64 is slightly larger than that of chip 11. Chip 11 is placed in cavity 64 and thermally coupled to chip mount 61 via a thermally conductive material.

By now it should be appreciated that a semiconductor device and a method for packaging a semiconductor chip into the semiconductor device have been provided. In accordance with the present invention, the semiconductor chip is flip chip mounted on a substrate or directly mounted on a circuit board. A thermally conductive chip mount is mounted to the semiconductor chip. More particularly, the semiconductor chip is placed in a cavity in the chip mount and is thermally coupled to the chip mount. The chip mount provides a thermal conduction path to dissipate the heat generated in the semiconductor chip through its sidewalls. In accordance with one embodiment, the cavity in the chip mount is a hole extending through the chip mount. A heat spreader is optionally thermally coupled to the back surface of the semiconductor chip. In accordance with another embodiment, the cavity extends only partially into the chip mount. A base surface of the cavity is thermally coupled to the back surface of the semiconductor chip. The chip mount is made of a thin, e.g., between approximately 200 µm and approximately 800 µm, layer of a thermally conductive material, e.g., copper, aluminum, etc. The chip mount enhances the thermal performance of the semiconductor device without significantly increasing its height. Further, the chip mount is easy to manufacture, light in weight, low in cost. The packaging process of the present invention is time efficient and compatible with existing device packaging processes.

What is claimed is:

1. A semiconductor device, comprising:

a semiconductor chin having a first surface, a second surface, and a sidewall;

a chip mount having a first surface, a second surface, and a cavity therein, the cavity having an edge coupled to the sidewall of said semiconductor chip, and wherein the cavity in said chip mount extends from the first surface of said chip mount to the second surface of said chip mount;

wherein the second surface of said chip mount is substantially coplanar with the second surface of said semiconductor chip; and a substrate having a major surface, wherein the first surface of said semiconductor chip is attached to a first portion of the major surface of said substrate via a solder bump.

2. The semiconductor device of claim 1, wherein the edge of the cavity in said chip mount compresses the sidewall of said semiconductor chip.

3. The semiconductor device of claim 1, wherein the edge of the cavity in said chip mount is coupled to the sidewall of said semiconductor chip via an epoxy.

4. The semiconductor device of claim 1, wherein the first surface of said chip mount is coupled to a second portion of the major surface of said substrate.

5. The semiconductor device of claim 1, further comprising a heat spreader overlying the second surface of said semiconductor chip and the second surface of said flag.

* * * * *